(12) United States Patent
Ishii

(10) Patent No.: US 10,318,210 B2
(45) Date of Patent: Jun. 11, 2019

(54) MEMORY CONTROLLER, STORAGE DEVICE, INFORMATION PROCESSING SYSTEM, AND METHOD OF CONTROLLING MEMORY

(71) Applicant: SONY CORPORATION, Tokyo (JP)

(72) Inventor: Ken Ishii, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/542,015

(22) PCT Filed: Oct. 19, 2015

(86) PCT No.: PCT/JP2015/079413
§ 371 (c)(1),
(2) Date: Jul. 6, 2017

(87) PCT Pub. No.: WO2016/117190
PCT Pub. Date: Jul. 28, 2016

(65) Prior Publication Data
US 2018/0011662 A1  Jan. 11, 2018

(30) Foreign Application Priority Data
Jan. 22, 2015 (JP) ................................. 2015-010326

(51) Int. Cl.
*G06F 3/06* (2006.01)
*G06F 12/00* (2006.01)
(Continued)

(52) U.S. Cl.
CPC .......... *G06F 3/0659* (2013.01); *G06F 3/0611* (2013.01); *G06F 3/0619* (2013.01);
(Continued)

(58) Field of Classification Search
CPC .. G06F 3/0659; G06F 3/0611; G06F 11/1068; G06F 3/0679; G06F 3/0619;
(Continued)

(56) References Cited

U.S. PATENT DOCUMENTS

| 6,564,304 B1 * | 5/2003 | Van Hook ........... G06F 13/1626 345/535 |
| 7,581,073 B2 * | 8/2009 | Gower .................... G06F 1/206 711/154 |

(Continued)

FOREIGN PATENT DOCUMENTS

| JP | 2005-242500 A | 9/2005 |
| JP | 2013-524388 A | 6/2013 |
| JP | 2014-154119 A | 8/2014 |

OTHER PUBLICATIONS

R. Ausavarungnirun, K. K. Chang, L. Subramanian, G. H. Loh and O. Mutlu, "Staged memory scheduling: Achieving high performance and scalability in heterogeneous systems," 2012 39th Annual International Symposium on Computer Architecture (ISCA), Portland, OR, 2012, pp. 416-427.*

(Continued)

*Primary Examiner* — Cynthia Britt
(74) *Attorney, Agent, or Firm* — Chip Law Group

(57) ABSTRACT

Writing time is shortened even in a memory writing time for each access unit is not constant. A writing time prediction information holding unit holds writing time prediction information for predicting the writing time in a plurality of memory modules for each of a plurality of memory modules. A request selecting unit preferentially selects a write request of which longer writing time is predicted out of a plurality of write requests requiring writing in each of a plurality of memory modules on the basis of the writing time prediction information.

14 Claims, 13 Drawing Sheets

(51) Int. Cl.
  *G06F 12/06* (2006.01)
  *G06F 11/10* (2006.01)
  *G11C 29/52* (2006.01)
  *G11C 29/42* (2006.01)
  *G11C 29/44* (2006.01)
  *G11C 5/04* (2006.01)

(52) U.S. Cl.
  CPC .......... *G06F 3/0679* (2013.01); *G06F 3/0688* (2013.01); *G06F 11/1048* (2013.01); *G06F 11/1068* (2013.01); *G06F 12/00* (2013.01); *G06F 12/06* (2013.01); *G11C 29/42* (2013.01); *G11C 29/44* (2013.01); *G11C 29/52* (2013.01); *G11C 5/04* (2013.01)

(58) Field of Classification Search
  CPC .......... G06F 12/06; G06F 12/00; G11C 29/44; G11C 29/52; G11C 29/42; G11C 5/04
  See application file for complete search history.

(56) References Cited

U.S. PATENT DOCUMENTS

| | | | | |
|---|---|---|---|---|
| 8,819,379 B2* | 8/2014 | Aho | ........................ | G06F 12/02 711/104 |
| 9,135,195 B2* | 9/2015 | Gupta | .................... | G06F 13/362 |
| 9,639,280 B2* | 5/2017 | Roberts | .................. | G06F 3/0611 |
| 9,740,485 B2* | 8/2017 | Mirichigni | .......... | G06F 9/30047 |
| 2003/0033493 A1* | 2/2003 | Cismas | ............... | G06F 13/1626 711/158 |
| 2004/0139286 A1* | 7/2004 | Lin | ...................... | G06F 13/1631 711/151 |
| 2008/0162852 A1* | 7/2008 | Kareenahalli | ....... | G06F 12/0215 711/167 |
| 2009/0016137 A1* | 1/2009 | Hur | ..................... | G06F 13/1626 365/226 |
| 2011/0258353 A1* | 10/2011 | Wang | .................. | G06F 13/1626 710/110 |
| 2011/0258354 A1* | 10/2011 | Wang | .................... | G06F 13/161 710/114 |
| 2013/0275795 A1* | 10/2013 | Ellis | ...................... | G06F 1/3268 713/324 |

OTHER PUBLICATIONS

International Search Report and Written Opinion of PCT Application No. PCT/JP2015/079413, dated Dec. 1, 2015, 1 pages of English Translation and 5 pages of ISRWO.

* cited by examiner

*FIG. 7*

| PAGE ADDRESS | MEMORY CHIP #0 | MEMORY CHIP #1 | MEMORY CHIP #2 | MEMORY CHIP #3 |
|---|---|---|---|---|
| 0×00000 | 10 | 8 | 12 | 15 |
| 0×00001 | 15 | 13 | 9 | 20 |
| ⋮ | ⋮ | ⋮ | ⋮ | ⋮ |
| 0×FFFFF | 10 | 10 | 16 | 12 |

FIG. 14

| BLOCK ADDRESS | MEMORY CHIP #0 | MEMORY CHIP #1 | MEMORY CHIP #2 | MEMORY CHIP #3 |
|---|---|---|---|---|
| #0×0 | 10 | 12 | 8 | 15 |
| #0×1 | 9 | 15 | 12 | 10 |
| ⋮ | ⋮ | ⋮ | ⋮ | ⋮ |
| #0×FF | 13 | 12 | 16 | 15 |

FIG. 15

| MEMORY CHIP #0 | MEMORY CHIP #1 | MEMORY CHIP #2 | MEMORY CHIP #3 |
|---|---|---|---|
| 1 | 3 | 2 | 4 |

MEMORY CONTROLLER, STORAGE DEVICE, INFORMATION PROCESSING SYSTEM, AND METHOD OF CONTROLLING MEMORY

CROSS REFERENCE TO RELATED APPLICATIONS

This application is a U.S. National Phase of International Patent Application No. PCT/JP2015/079413 filed on Oct. 19, 2015, which claims priority benefit of Japanese Patent Application No. JP 2015-010326 filed in the Japan Patent Office on Jan. 22, 2015. Each of the above-referenced applications is hereby incorporated herein by reference in its entirety.

TECHNICAL FIELD

The present technology relates to a memory controller. In detail, this relates to a memory controller which writes data in a nonvolatile memory and verifies the same, a storage device, an information processing system, and a method of controlling a memory.

BACKGROUND ART

Conventionally, a storage device formed of a memory such as a dynamic random access memory (DRAM) being a volatile memory and a nonvolatile memory is used in an information processing device. In the storage device, data is accessed on the basis of a command issued by a host computer which is the information processing device. A storage device capable of processing the issued command at a high speed is required for improving processing ability of the information processing device.

The nonvolatile memory requires verification to determine whether writing is normally performed after the data is written and rewriting based on a result of the verification. A NAND flash memory, a resistance RAM (ReRAM), a phase-change RAM (PCRAM), a magnetoresistive RAM (MRAM) and the like corresponds to such nonvolatile memory. The number of times of verification and rewriting differ from one memory cell to another. For example, a physical property of a storage element which stores the data in a memory cell differs from one memory cell to another, so that the number of times of verification also differs from one memory cell to another. Also, in the nonvolatile memory, the storage element may be damaged due to deterioration by the writing. Therefore, the number of times of verification increases in the memory cell with higher writing frequency. With this arrangement, writing time for each page being an access unit also changes for each the page. As a result, time required for writing differs among a plurality of write commands issued to the storage device in which such nonvolatile memory is used. Meanwhile, in a case where the writing is not performed normally although the number of times of verification and rewriting reaches a predetermined limit number, the writing in this page is determined to be unsuccessful. In this case, error handling is performed, for example.

On the other hand, there is stand-by time by activation and precharge of the memory cell at the time of writing in a synchronous DRAM (SDRAM) being a type of the DRAM. Therefore, although time required for writing the data in the memory cell is constant in the SDRAM, execution time of the write command including the stand-by time differs from one command to another. In the storage device in which a plurality of SDRAMs is used, a system of speeding up the process of a plurality of issued write commands is proposed. For example, a system provided with a memory controller including a command history buffer which holds the issued commands and an order control unit which changes command issuing order is proposed (for example, refer to Patent Document 1).

CITATION LIST

Patent Document

Patent Document 1: Japanese Patent Application Laid-Open No. 2014-154119

SUMMARY OF THE INVENTION

Problems to be Solved by the Invention

In the above-described conventional technology, the command issuing order is controlled when a plurality of SDRAMs is used in the storage device. Specifically, in a case where there is the SDRAM in which the stand-by time such as the precharge is generated by the command issued in the past, the issuing order is changed such that the command to another SDRAM is issued first. In this manner, according to the above-described conventional technology, it is possible to shorten command processing time for a plurality of SDRAMs. However, such conventional technology supposes the SDRAM in which predetermined stand-by time such as the precharge is generated. There is a problem that the writing time cannot be shortened in the storage device in which the memory in which the writing time differs for each access unit as the above-described ReRAM is used.

The present technology is achieved in consideration of such a condition, and an object thereof is to shorten the writing time in the storage device in which the memory in which the writing time for each page being the access unit is not constant.

Solutions to Problems

The present technology is achieved for solving the above-described problems and a first aspect thereof is a memory controller including a writing time prediction information holding unit which holds writing time prediction information for predicting writing time in a plurality of memory modules for each of the plurality of memory modules, and a request selecting unit which preferentially selects a write request of which longer writing time is predicted out of a plurality of write requests requiring writing in each of the plurality of memory modules on the basis of the writing time prediction information. With this arrangement, there is an effect that the write request of which longer writing time is predicted out of a plurality of write requests is preferentially selected.

Also, the first aspect may be further provided with a writing time prediction information generating unit which generates the writing time prediction information to be held in the writing time prediction information holding unit. With this arrangement, there is an effect that the writing time prediction information is generated.

Also, in the first aspect, the writing time prediction information generating unit may measure the writing time for each of the plurality of memory modules to be held in the writing time prediction information holding unit as the writing time prediction information. With this arrangement, there is an effect that the writing time prediction information is generated by the writing time measured for each memory module.

Also, in the first aspect, the writing time prediction information generating unit may measure the number of times of verification to read data from the plurality of memory modules in which the writing is performed to determine whether the read data and write data regarding the writing are the same for each of the plurality of memory modules to be held in the writing time prediction information holding unit as the writing time prediction information. With this arrangement, there is an effect that the writing time prediction information is generated by the number of times of verification measured for each memory module.

Also, in the first aspect, the writing time prediction information generating unit may measure the number of times of writing in the plurality of memory modules for each of the plurality of memory modules to be held in the writing time prediction information holding unit as the writing time prediction information. With this arrangement, there is an effect that the writing time prediction information is generated by the number of times of writing measured for each memory module.

Also, the first aspect may be further provided with an error correcting unit which detects to correct an error of read data read from the plurality of memory modules, and the writing time prediction information generating unit may measure the number of bits in which the error is corrected by the error correcting unit in the corrected read data for each of the plurality of memory modules to be held in the writing time prediction information holding unit as the writing time prediction information. A storage element of a memory cell corresponding to the bit in which the error is corrected might be extremely damaged. In this case, the number of times of verification increases, so that the writing time may be predicted by the number of bits in which the error is corrected. With this arrangement, there is an effect that the writing time prediction information is generated by the number of bits in which the error is corrected measured for each memory module.

Also, in the first aspect, the writing time prediction information generating unit may measure the number of times of unsuccessful writing in the plurality of memory modules for each of the plurality of memory modules to be held in the writing time prediction information holding unit as the writing time prediction information. With this arrangement, there is an effect that the writing time prediction information is generated by the number of times of unsuccessful writing measured for each memory module.

Also, the first aspect may be further provided with a plurality of request queues each of which is provided for each of the plurality of memory modules to hold the write requests for each of the plurality of memory modules in a first-in first-out manner, and the request selecting unit may select on the basis of the writing time prediction information from the write requests held at the top of the plurality of request queues. With this arrangement, there is an effect that the write request held at the top of the request queue is selected.

Also, in the first aspect, the plurality of memory modules may be such that a storage area in which data is stored is accessed in unit of page obtained by dividing according to a page size, and the writing time prediction information holding unit may hold the writing time prediction information for each page. With this arrangement, there is an effect that the write request is selected on the basis of the writing time prediction information for each page.

Also, in the first aspect, the plurality of memory modules may be such that a storage area in which data is stored is accessed in unit of page obtained by dividing according to a page size, and the writing time prediction information holding unit may hold the writing time prediction information for each block formed of a plurality of pages. With this arrangement, there is an effect that the write request is selected on the basis of the writing time prediction information for each block.

Also, the first aspect may be provided with a writing time prediction information holding unit which holds writing time prediction information for predicting writing time in a plurality of memory banks in a memory module in which a storage area in which data is stored is formed of the plurality of memory banks for each of the plurality of memory banks, and a request selecting unit which preferentially selects a write request of which longer writing time is predicted out of a plurality of write requests requiring writing in each of the plurality of memory banks on the basis of the writing time prediction information. With this arrangement, there is an effect that the write request of which longer writing time is predicted out of a plurality of write requests is preferentially selected in the memory module including the memory bank.

Also, a second aspect of the present technology is a storage device including a plurality of memory modules, a writing time prediction information holding unit which holds writing time prediction information for predicting writing time in the plurality of memory modules for each of the plurality of memory modules, and a request selecting unit which preferentially select a write request of which longer writing time is predicted out of a plurality of write requests requiring writing in each of the plurality of memory modules on the basis of the writing time prediction information. With this arrangement, there is an effect that the write request of which longer writing time is predicted out of a plurality of write requests is preferentially selected.

Also, a third aspect of the present technology is an information processing system including a storage device provided with a plurality of memory modules, a writing time prediction information holding unit which holds writing time prediction information for predicting writing time in the plurality of memory modules for each of the plurality of memory modules and a request selecting unit which preferentially selects a write request of which longer writing time is predicted out of a plurality of write requests requiring writing in each of the plurality of memory modules on the basis of the writing time prediction information, and a host computer which accesses the storage device. With this arrangement, there is an effect that the write request of which longer writing time is predicted out of a plurality of write requests is preferentially selected.

Also, a fourth aspect of the present technology is a method of controlling a memory including a request selecting procedure to preferentially select a write request of which longer writing time is predicted out of a plurality of write requests requiring writing in each of a plurality of memory modules on the basis of writing time prediction information for predicting the writing time. With this arrangement, there is an effect that the write request of which longer writing time is predicted out of a plurality of write requests is preferentially selected.

Effects of the Invention

The present technology might have an excellent effect that writing time may be shortened in a memory in which writing time for each page is not constant. Meanwhile, the effects are not necessarily limited to the effects herein described and may include any of the effects described in the present disclosure.

BRIEF DESCRIPTION OF DRAWINGS

FIG. 7 is a view illustrating writing time prediction information in the first embodiment of the present technology.

FIG. 14 is a view illustrating writing time prediction information in a second embodiment of the present technology.

FIG. 15 is a view illustrating writing time prediction information in a third embodiment of the present technology.

MODE FOR CARRYING OUT THE INVENTION

A mode for carrying out the present technology (hereinafter, referred to as an embodiment) is hereinafter described. The description is given in the following order.

1. First Embodiment (Example of Case in Which Writing Time Prediction Information for Each Page Is Used)

2. Second Embodiment (Example of Case in Which Writing Time Prediction Information for Each Block Is Used)

3. Third Embodiment (Example of Case in Which Writing Time Prediction Information for Each Memory Module Is Used)

4. Fourth Embodiment (Example of Case in Which Writing Time Prediction Information for Each Page or Block Is Used in Memory Module Including Memory Bank)

1. First Embodiment

[Configuration of Information Processing System]

Figure 1:
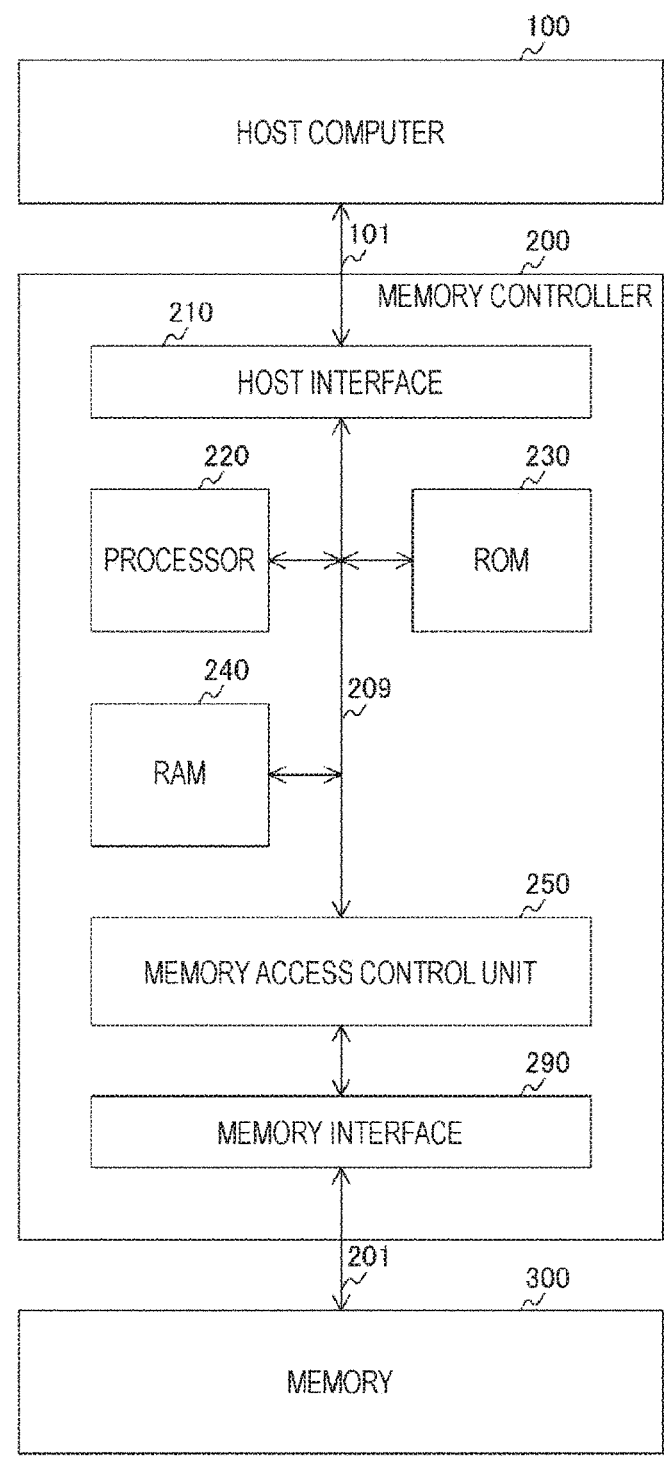
FIG. 1 is a view illustrating a configuration example of an information processing system in an embodiment of the present technology.

FIG. 1 is a view illustrating a configuration example of an information processing system of an embodiment of the present technology. The information processing system in FIG. 1 is provided with a host computer 100, a memory controller 200, and a memory 300. Meanwhile, the memory controller 200 and the memory 300 forma storage device.

The host computer 100 performs various processes in the information processing system. The host computer 100 issues a command to write or read to the memory 300 to access through the memory controller 200. A signal line 101 electrically connects the host computer 100 to the memory controller 200.

The memory controller 200 controls the memory 300. The memory controller 200 interprets the write and read commands issued from the host computer 100 and issues write and read requests based on them to the memory 300.

The memory 300 records data. The data is accessed on the basis of the request issued by the memory controller 200. At that time, the data is transferred between the memory 300 and the memory controller 200. Meanwhile, the memory 300 is formed of a memory module. Herein, the memory module being a module which stores the data is the module formed of a single or a plurality of memory chips and the like. A signal line 201 electrically connects the memory controller 200 to the memory 300.

When writing, the host computer 100 issues the write command and write data associated with the write command to the memory controller 200. Herein, the write command is a command formed of an operation code indicating a write destination address and the number of write data. The memory controller 200 generates the write request on the basis of the write command and the write data associated with the same and issues the same to the memory 300. The memory 300 writes on the basis of the request. Thereafter, the memory 300 outputs a write result to the memory controller 200 as a response.

On the other hand, at the time of reading, the host computer 100 issues the read command to the memory controller 200. Herein, the read command is a command formed of an operation code indicating reading, a read destination address, and the number of read data. The memory controller 200 generates the read request on the basis of the read command and issues the same to the memory 300. The memory 300 reads on the basis of the request and outputs the read data to the memory controller 200. The memory controller 200 outputs the output data to the host computer 100 as the read data.

[Configuration of Memory Module]

Figure 2A:
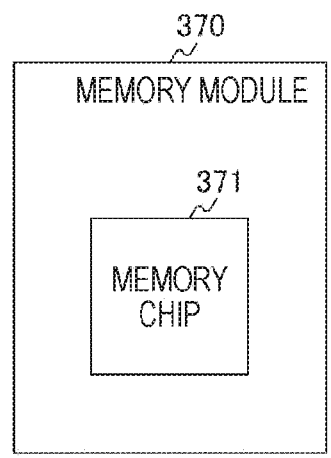
FIGS. 2a and 2b are views illustrating a configuration example of a memory module in the embodiment of the present technology.
Figure 2B:
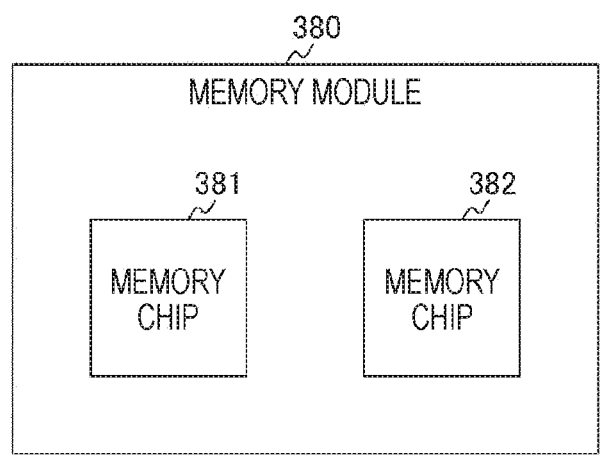

FIGS. 2a and 2b are views illustrating a configuration example of the memory module in the embodiment of the present technology. An example of a memory module 370 formed of a memory chip 371 is illustrated in a of FIG. 2a. Also, an example of a memory module 380 formed of two memory chips 381 and 382 is illustrated in b of FIG. 2b. A memory chip formed of a ReRAM being a nonvolatile memory is supposed as the memory chip forming the memory modules. The ReRAM being a variable resistance memory is the memory including a storage element which reversibly changes a resistance value to store.

[Configuration of Memory Controller]

The memory controller 200 is provided with a host interface 210, a processor 220, a ROM 230, a RAM 240, a memory access control unit 250, and a memory interface 290.

The host interface 210 communicates with the host computer. The processor 220 controls each unit in the memory controller 200. The ROM 230 is a memory which stores firmware of the processor 220. The RAM 240 is a memory which temporarily stores data required for processing the processor 220. The memory access control unit 250 issues the request to the memory 300. A bus 209 connects the units in the memory controller 200 to one another. The memory interface 290 communicates with the memory 300.

When the write command and the like is issued from the host computer 100 through the host interface 210, the processor 220 transfers the command to the memory access control unit 250. Thereafter, the memory access control unit 250 converts the command to the request and issues the same to the memory 300 through the memory interface 290. The memory access control unit 250 is described later in detail.

[Configuration of Memory]

Figure 3:
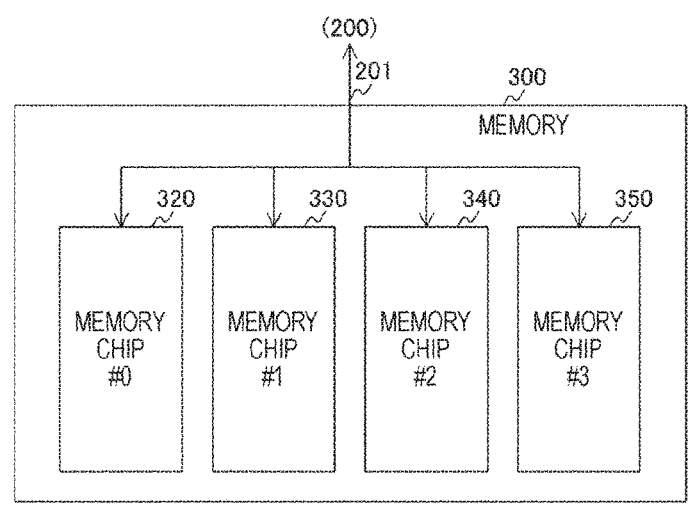
FIG. 3 is a view illustrating a configuration example of a memory 300 in a first embodiment of the present technology.

FIG. 3 is a view illustrating a configuration example of the memory 300 in the first embodiment of the present technology. The memory 300 is provided with a memory chip #0 (320), a memory chip #1 (330), a memory chip #2 (340), and a memory chip #3 (350). Meanwhile, the memory chips #0 (320) to #3 (350) are examples of the memory module recited in claims. That is to say, in the first embodiment of the present technology, the memory 300 including four memory modules is supposed and it is supposed that each of the memory modules is formed of a single memory chip. Meanwhile, the data in the memory modules may be independently accessed.

Each of the memory chips #0 (320) to #3 (350) is a semiconductor device including a storage area in which the data is stored. As described above, the memory chip formed of the ReRAM is supposed as the memory chip in the embodiment of the present technology. Furthermore, the above-described storage area is formed of a plurality of pages and it is supposed that it is accessed in page unit. The page has a size of 512 kilobytes, for example. The data in the memory chips may be independently accessed. The memory controller 200 adds an identification number for identifying the memory chip to the request when issuing the request. In the above-described example, #0 to #3 correspond to the identification numbers. Meanwhile, it is possible to choose a method in which the identification number is converted to a chip selecting signal for selecting from the memory chips #0 (320) to #3 (350), for example, to be output to the memory 300. In this case, the request is commonly input to the memory chips #0 (320) to #3 (350) and only the memory chip selected by the chip selecting signal performs a process according to the request.

[Configuration of Memory Cell]

Figure 4:
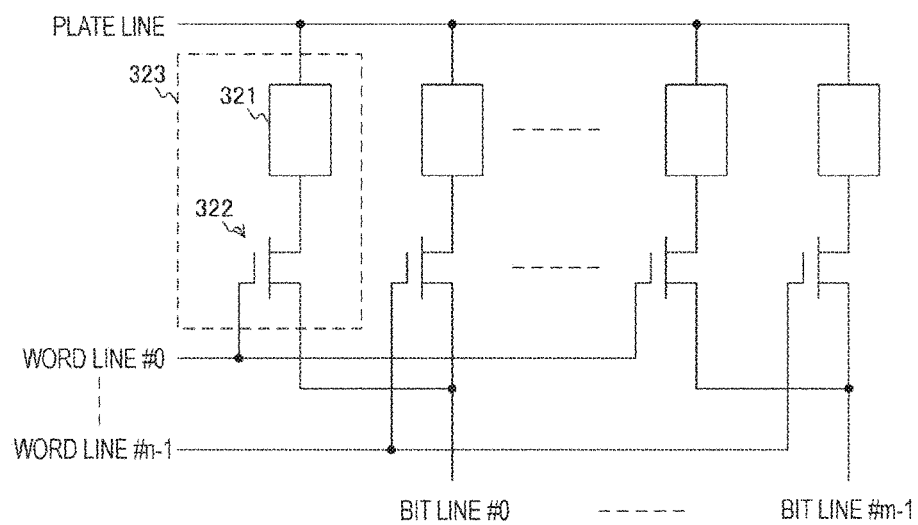
FIG. 4 is a view illustrating a configuration example of a memory cell in the embodiment of the present technology.

FIG. 4 is a view illustrating a configuration example of a memory cell in the embodiment of the present technology. FIG. 4 illustrates a configuration of the memory cell in the storage area of the ReRAM forming the memory chip #0 (320) and the like illustrated in FIG. 3. As illustrated in FIG. 4, a one-bit memory cell 323 is formed of the storage element 321 and a MOSFET 322. Meanwhile, the MOSFET 322 is a transistor which drives the storage element 321. One end of the storage element 321 is connected to a plate line being a common signal line and the other end thereof is connected to a drain terminal of the MOSFET 322. A gate terminal of the MOSFET 322 is connected to one of a plurality of word lines and a source terminal thereof is connected to one of a plurality of bit lines. The word line and the bit line are arranged in an XY matrix pattern for the MOSFET 322 forming the memory cell 323. With this arrangement, when one of the word lines and one of the bit lines are selected and the signal is input thereto, one memory cell 323 is selected and the data is written or read. For example, in a case where the memory cell 323 illustrated on a left end of FIG. 4 is selected, a word line #0 and a bit line #0 are selected.

The storage element 321 is an element which stores the data. A resistance value of the storage element 321 changes by polarity of voltage applied thereto. For example, based on the terminal connected to the plate line of the storage element 321, it is possible to put the storage element 321 into a high resistance state by applying voltage (write voltage) of positive polarity to the other terminal of the storage element 321. On the other hand, it is possible to put the storage element 321 into a low resistance state by applying the write voltage of negative polarity to the other terminal of the storage element 321. Meanwhile, the high resistance state is referred to as HRS and the low resistance state is referred to as LRS in the following description. The two states are made correspond to logical values to store the data. For example, a case in which the storage element 321 is in the LRS may correspond to a value "1" and a case in which the storage element 321 is in the HRS may correspond to a value "0". In this manner, it is possible to write the data in the memory cell 323 by changing the resistance value of the storage element 321. Meanwhile, operation to write the value "1" in the memory cell 323 is referred to as set operation and operation to write the value "0" in the memory cell 323 is referred to as reset operation and the writing is performed by performing two operations.

Meanwhile, the set operation and the reset operation are simultaneously performed for a plurality of memory cells 323. When the set operation is performed, one of a plurality of word lines is selected. For example, the word line #0 is selected and an on-voltage is applied thereto. With this arrangement, the MOSFET 322 connected to the word line #0 is put into an on-state. Next, the bit line connected to the memory cell 323 which performs the set operation is selected and the write voltage of the negative polarity with respect to the plate line is applied thereto. Then, the storage element 321 of the memory cell 323 connected to the selected bit line is put into the LRS and the value "1" is written therein. When the reset operation is performed, the word line #0 is selected as is the case with the set operation and the on-voltage is applied thereto. Next, the bit line connected to the memory cell 323 on which the reset operation is performed is selected and the write voltage of the positive polarity with respect to the plate line is applied thereto. Then, the storage element 321 of the memory cell 323 connected to the selected bit line is put into the HRS and the value "0" is written therein. In this manner, it is possible to write in a plurality of memory cells connected to one word line. The number of memory cells 323 in which the writing may be performed by one write operation corresponds to the above-described page size. In an example of FIG. 4, the page size is supposed to be m bits.

Verification is performed after the above-described set operation and reset operation are executed. Herein, the verification is a process of determining whether desired write data is written in the memory cell 323. As a result of the verification, in a case where the desired write data is not written in the memory cell 323, the set operation or the reset operation is performed again. The verification may be performed by reading from the memory cell in which the writing is performed and determining whether read data and the write data regarding the writing are the same. A characteristic of the storage element 321 varies from one memory cell 323 to another; although there is the memory cell 323 in which the writing is finished by one set operation or reset operation, there is the memory cell 323 in which the writing is finished after several times of writing and verification. Therefore, time required for writing varies from one page to another. Also, in a case where the value of the memory cell 323 is not a desired value even though the verification and rewriting are performed predetermined number of times, the memory 300 may process supposing that the writing is unsuccessful in this page.

As described above, the memory 300 outputs the write result to the memory controller 200 as the response. In a case where the writing process is successful, the memory 300 outputs the response indicating that the writing is successful to the memory controller 200. On the other hand, in a case where the writing is unsuccessful, the memory 300 outputs the response indicating that the writing is unsuccessful. In a case where the response indicating that the writing is unsuccessful is output from the memory 300, the memory controller 200 or the host computer 100 performs a process to respond to the unsuccessful writing.

Meanwhile, the data is read from the memory cell 323 by measuring flowing current while applying voltage lower than the write voltage to the storage element 321 and determining whether the device is in the LRS or in the HRS.

[Configuration of Memory Access Control Unit]

Figure 5:
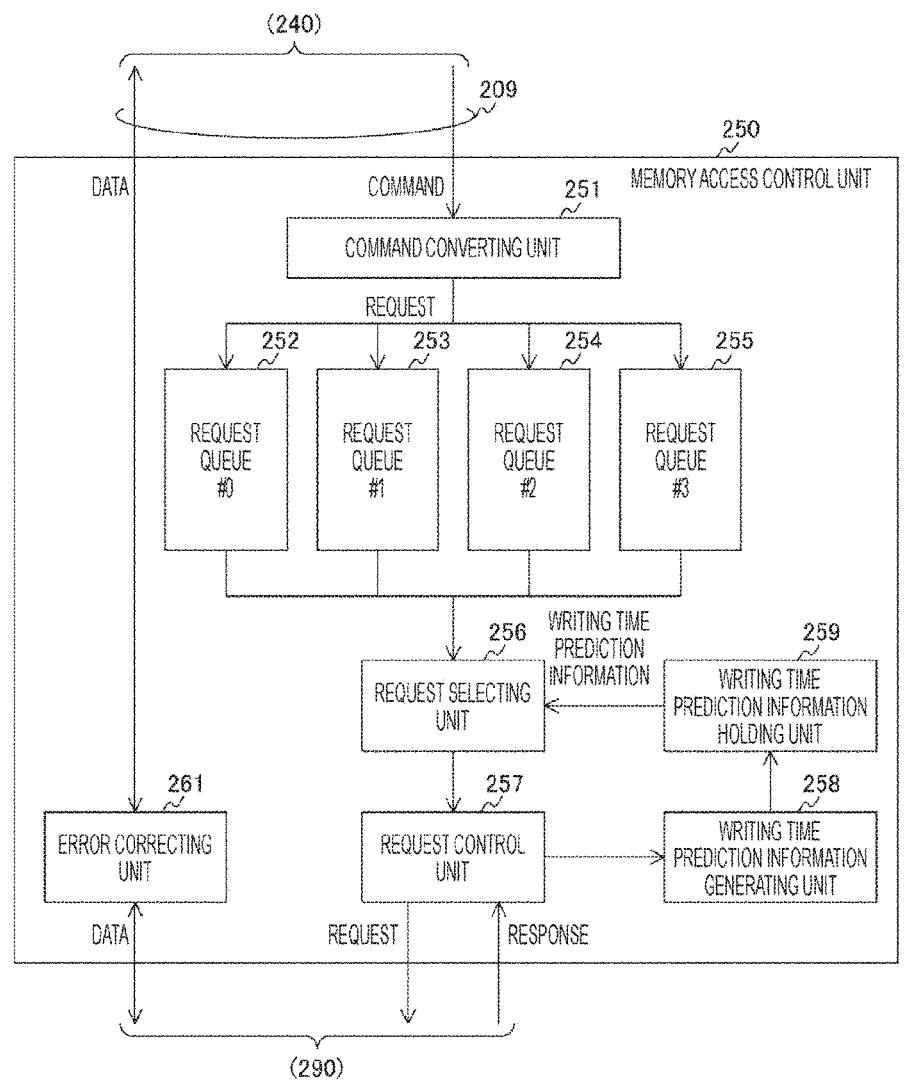
FIG. 5 is a view illustrating a configuration example of a memory access control unit 250 in the first embodiment of the present technology.

FIG. 5 is a view illustrating a configuration example of the memory access control unit 250 in the first embodiment of the present technology. The memory access control unit 250 is provided with a command converting unit 251, a request queue #0 (252), a request queue #1 (253), a request queue #2 (254), a request queue #3 (255), and a request selecting unit 256. Also, the memory access control unit 250 is provided with a request control unit 257, a writing time prediction information generating unit 258, a writing time prediction information holding unit 259, and an error correcting unit 261.

The command converting unit 251 converts the command issued by the host computer 100 and the write destination address, the read destination address and the like included therein to the request. Herein, the write destination address and the read destination address included in the command issued by the host computer 100 are indicated by page addresses in page unit and it is supposed that the number of write data and the number of read data are indicated by the numbers of pages. Also, the number of data which may be accessed by one request is supposed to be one page. In a case where the number of data of the command is a plurality of pages, the command converting unit 251 converts the command to a plurality of requests and assigns them to a plurality of memory chips.

A method of assigning lower two bits of the page addresses of the write destination and read destination to the identification numbers of the memory chips #0 (320) to #3 (350) may be chosen as a method of assigning. For example, in a case where the command is the write command, the write destination page address is 0x0, and the number of data is four pages, the command converting unit 251 converts the command to four requests. The four requests are assigned to the memory chips #0 (320) to #3 (350). In this manner, the command converting unit 251 converts the command to the requests to the memory chips #0 (320) to #3 (350) and allows the request queue to be described next to hold the same.

The request queues #0 (252) to #3 (255) hold the requests converted by the command converting unit 251 and performs first-in first-out operation of the held requests. Also, the request queues #0 (252) to #3 (255) correspond to the memory chips #0 (320) to #3 (350) of the same identification number in the memory 300 on one-to-one basis. That is to say, the number of request queues is the same as the number of memory chips and only the request of the corresponding memory chip is held in the request queue. A first-in first-out (FIFO) memory may be used as the request queue.

The writing time prediction information holding unit 259 holds writing time prediction information. Herein, the writing time prediction information is a prediction value of the writing time in the memory chips #0 (320) to #3 (350). In the first embodiment of the present technology, the memory chips #0 (320) to #3 (350) are accessed in page unit. Therefore, the writing time prediction information is generated for each page to be held in the writing time prediction information holding unit 259. A memory formed of a volatile memory such as a DRAM may be used as the writing time prediction information holding unit 259. Meanwhile, in this case, it is required to store the writing time prediction information held in the writing time prediction information holding unit 259 in the nonvolatile memory and the like when the information processing system stops. Then, a process of reading the writing time prediction information from the nonvolatile memory to allow the writing time prediction information holding unit 259 to hold the same is required at the time of start-up of the information processing system. The writing time prediction information is to be described later in detail.

The request selecting unit 256 selects the requests held at the top of the request queues #0 (252) to #3 (255). The request selecting unit selects the requests in a case where there are two or more memory chips which may receive the request and the request is held in each of the request queues corresponding to the memory chips. Meanwhile, the memory chip which may receive the request is the memory chip to which the request is not issued and on which a process such as writing is not performed. In a case where the request held in the request queue is the write request, the request selecting unit 256 preferentially selects the request long writing time thereof is predicted. This is selected on the basis of the writing time prediction information held in the writing time prediction information holding unit 259. Meanwhile, in a case where there is one memory chip which may receive the request, the request selecting unit 256 selects the request of the request queue corresponding to the memory chip and outputs the same to the request control unit 257.

The request control unit 257 controls communication of the request with the memory 300. The request control unit 257 outputs the request selected by the request selecting unit 256 to the memory 300. In a case where the request is the write request, this outputs notification (request delivery notification) indicating that the request is output to the writing time prediction information generating unit 258 to be described later. Also, the request control unit 257 outputs notification (response reception notification) indicating that the response is input to the writing time prediction information generating unit 258 when the response to the output request is input from the memory 300. The request delivery notification is output together with the identification number of the memory chip and the page address and the response reception notification is output together with the identification number of the memory chip.

The writing time prediction information generating unit 258 measures writing time for each page in the memory chips #0 (320) to #3 (350) and allows the writing time prediction information holding unit 259 to hold the same as the writing time prediction information. The writing time prediction information generating unit 258 is to be described later in detail.

The error correcting unit 261 encodes the write data and decodes the read data. Herein, coding is a process of adding parity to the write data to obtain an ECC code. Parity generated by using a Bose Chaudhuri Hocquenghem (BCH) code may be used, for example, as the parity. Also, decoding is a process of obtaining original data from the ECC code. At the time of decoding, data error detection and correction are performed.

[Configuration of Writing Time Prediction Information Generating Unit]

Figure 6:
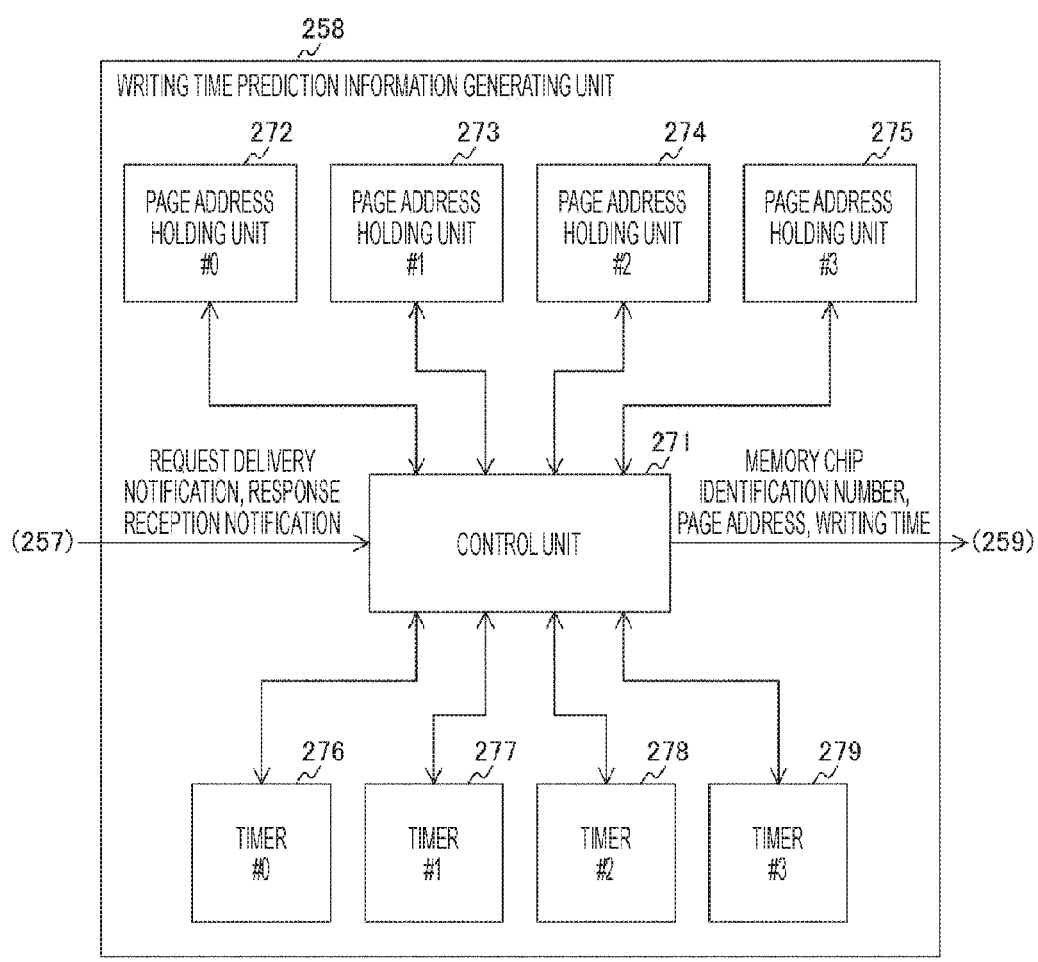
FIG. 6 is a view illustrating a configuration example of a writing time prediction information generating unit 258 in the first embodiment of the present technology.

FIG. 6 is a view illustrating a configuration example of the writing time prediction information generating unit 258 in the first embodiment of the present technology. The writing time prediction information generating unit 258 is provided with a control unit 271, a page address holding unit #0 (272), a page address holding unit #1 (273), a page address holding unit #2 (274), and a page address holding unit #3 (275). Also, the writing time prediction information generating unit 258 is provided with a timer #0 (276), a timer #1 (277), a timer #2 (278), and a timer #3 (279).

The page address holding units #0 (272) to #3 (275) hold the page addresses of the write requests output by the request control unit 257. The page address holding units #0 (272) to #3 (275) correspond to the memory chips #0 (320) to #3 (350) of the same identification number on one-to-one basis and hold the page addresses of the write requests of the memory chips.

The timers #0 (276) to #3 (279) are timers which measure time required for writing. The timers #0 (276) to #3 (279) correspond to the memory chips #0 (320) to #3 (350) of the same identification number on one-to-one basis and measure the writing time. The timers are controlled to start/stop measuring time by the control unit 271 to be described next.

The control unit 271 controls the page address holding units #0 (272) to #3 (275) and the timers #0 (276) to #3 (279). The control unit 271 performs a process on the corresponding timer and page address holding unit on the basis of the identification number of the memory chip included in the request delivery notification in a case where the request delivery notification is output from the request control unit 257. For example, in a case where the memory chip identification number included in the request delivery notification indicates the memory chip #0 (320), the control unit 271 allows the timer #0 (276) to start measuring time. Furthermore, the control unit 271 allows the page address holding unit #0 (272) to hold the page address included in the request delivery notification.

Also, in a case where the response reception notification is output from the request control unit 257, the control unit 271 allows the corresponding timer to stop measuring time on the basis of the identification number of the memory chip included in the response reception notification. Thereafter, the control unit 271 obtains the measured time from the timer, obtains the page address from the corresponding page address holding unit, and outputs the same to the writing time prediction information holding unit 259 together with the identification number of the memory chip. With this arrangement, the measured writing time is held in the writing time prediction information holding unit 259 as the writing time prediction information.

[Writing Time Prediction Information]

FIG. 7 is a view illustrating the writing time prediction information in the first embodiment of the present technology. FIG. 7 illustrates the writing time prediction information held by the writing time prediction information holding unit 259. The writing time prediction information in the first embodiment of the present technology is such that time required for writing in each memory chip is recorded for each page address. Meanwhile, the writing time is a value represented in µs unit. It is possible to predict the writing time of the write request to be selected by the request selecting unit 256 by the recorded writing time. The request selecting unit 256 obtains the prediction information of the writing time of the write request from the writing time prediction information by using the memory chip identification number and the page address. Next, the request selecting unit 256 selects the write request to the memory chip the long writing time of which is predicted on the basis of the prediction information.

[Write Request Selecting Process]

Figure 8A:
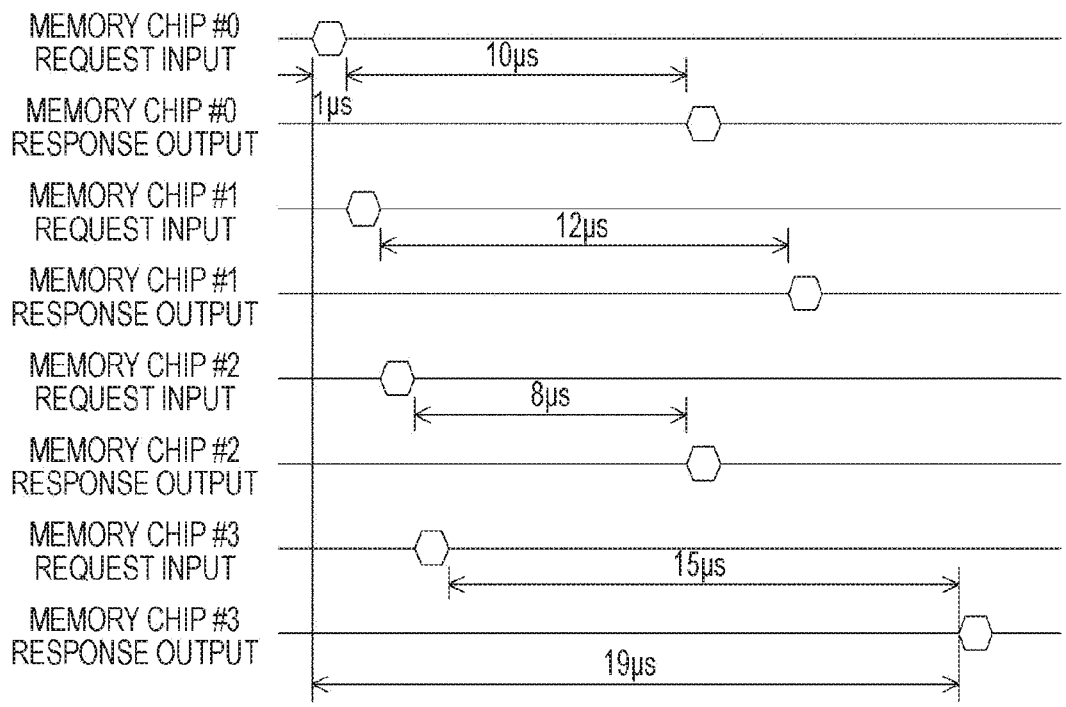
FIGS. 8a and 8b are views illustrating a write request selecting process in the first embodiment of the present technology.
Figure 8B:
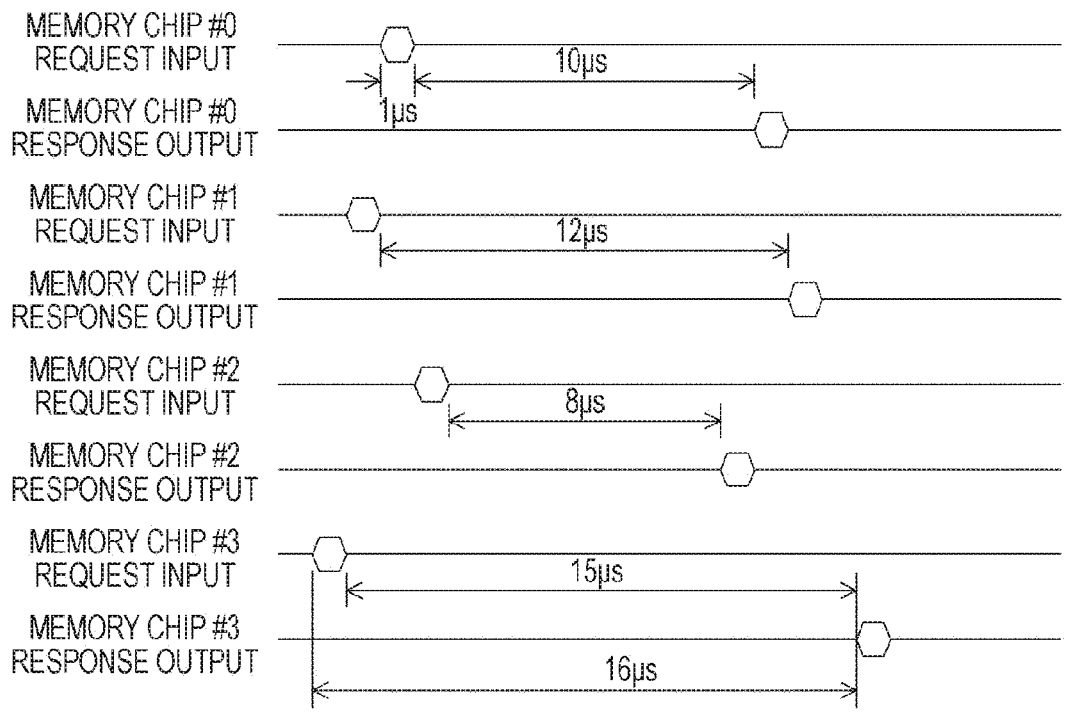

FIGS. 8a and 8b are views illustrating a write request selecting process in the first embodiment of the present technology. FIGS. 8a and 8b illustrate a relationship between a request input and a response output of each of the memory chips #0 to #3. Meanwhile, 1 µs is supposed as time required for inputting the request. On the other hand, time required for writing is different from one memory chip to another and time as illustrated in FIGS. 8a and 8b is supposed, for each of them. For example, the writing time of 10 µs is supposed in the memory chip #0. Meanwhile, the writing time is made the same as the writing time corresponding to a page address 0x00000 out of the writing time prediction information illustrated in FIG. 7. A case in which the requests are selected to be executed in order of identification numbers of the corresponding memory chips is illustrated in a of FIG. 8a, and a case in which the requests are selected to be executed in descending order of predicted writing time is illustrated in FIG. 8b. With this arrangement, it is understood that although time from the inputs of the four requests to the outputs of the responses is 19 µs in a of FIG. 8a, this is shortened to be 16 µs in b of FIG. 8b. In this manner, a plurality of write requests may be executed more rapidly by selecting the write requests to execute in descending order of the predicted writing time.

[Writing Process]

Figure 9:
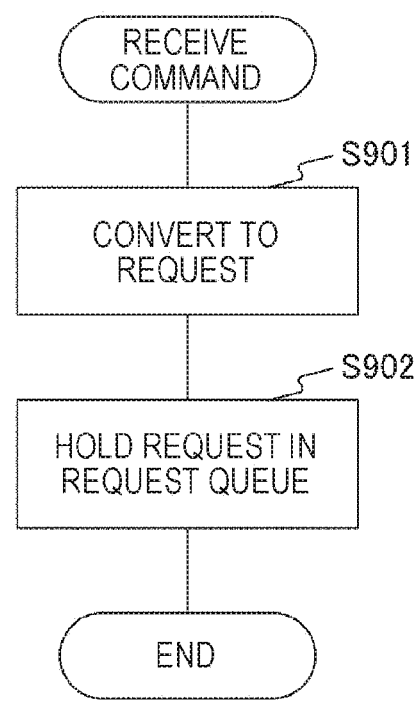
FIG. 9 is a view illustrating an example of a procedure of a command receiving process in the first embodiment of the present technology.

FIG. 9 is a view illustrating an example of a procedure of a command receiving process in the first embodiment of the present technology. When the command is issued from the host computer, the memory controller 200 starts this process. First, the command converting unit 251 converts the command to the request (step S901). Next, the command converting unit 251 allows the request queue corresponding to the memory chip being the destination of the request to hold the request (step S902) and finishes the command receiving process.

Figure 10:
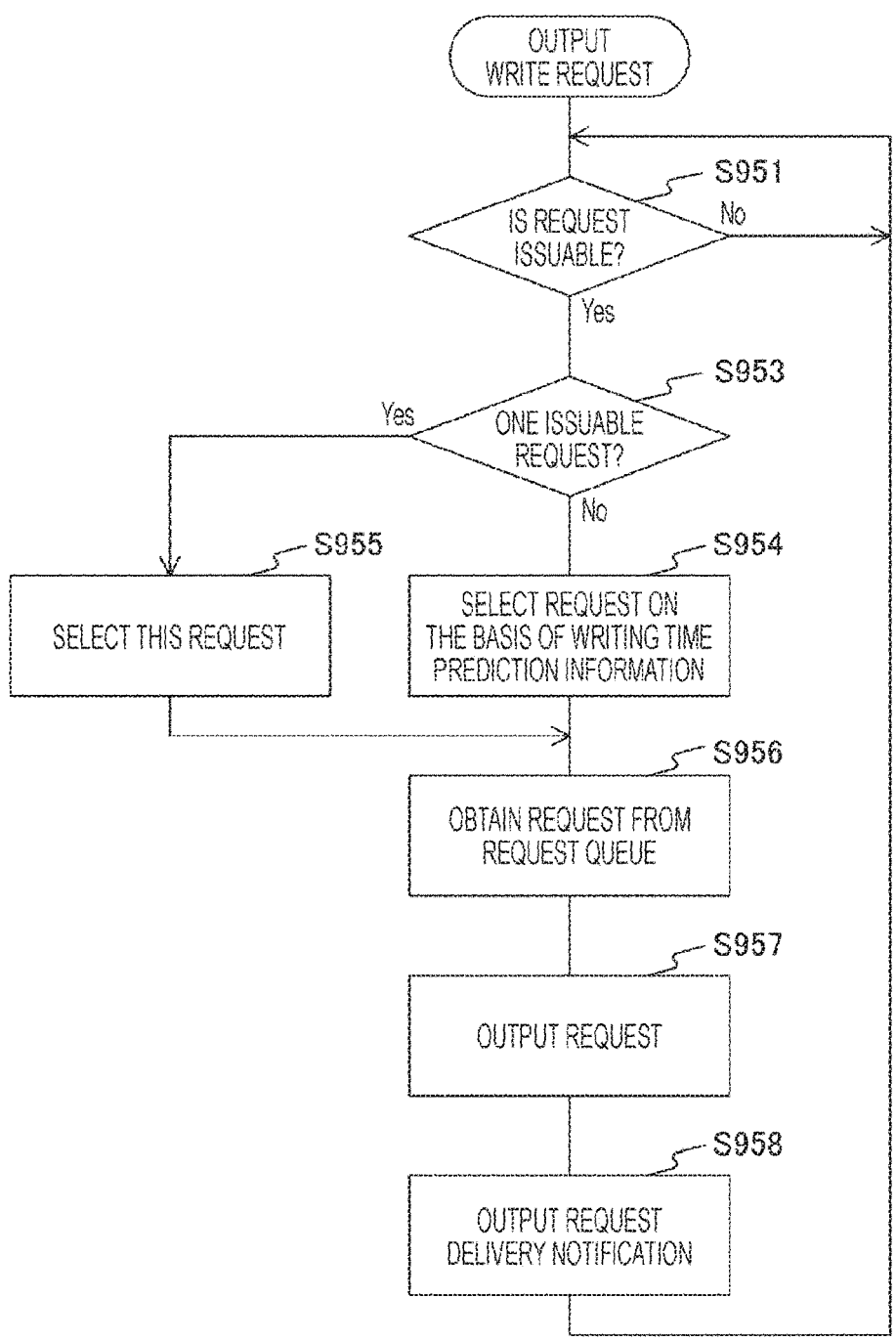
FIG. 10 is a view illustrating an example of a procedure of a write request outputting process in the first embodiment of the present technology.

FIG. 10 is a view illustrating an example of a procedure of a write request outputting process in the first embodiment of the present technology. First, the memory controller 200 determines whether the request may be issued (step S951). That is to say, in a case where there is the memory chip on which the process based on the request is not performed and the request is held in the request queue corresponding to the memory chip, the memory controller 200 determines that the request may be issued. In a case where the request cannot be issued, the memory controller 200 waits until the request may be issued (step S951). In a case where the request may be issued (step S951: Yes), the memory controller 200 checks the number of requests which may be issued (step S953). In a case where there is one request which may be issued (step S953: Yes), this request is selected by the request selecting unit 256 (step S955) and the procedure shifts to a process at step S956.

On the other hand, in a case where there are two or more requests which may be issued (step S953: No), the request selecting unit 256 selects the request on the basis of the writing time prediction information (step S954). Thereafter, the memory controller 200 shifts to the process at step S956. At step S956, the request selecting unit 256 obtains the request from the request queue (step S956) and outputs to the memory 300 (step S957). Next, the request control unit 257 outputs the request delivery notification to the writing time prediction information generating unit 258 (step S958). Thereafter, the memory controller 200 shifts to the process at step S951 again and repeatedly executes the write request outputting process.

[Response Inputting Process]

Figure 11:
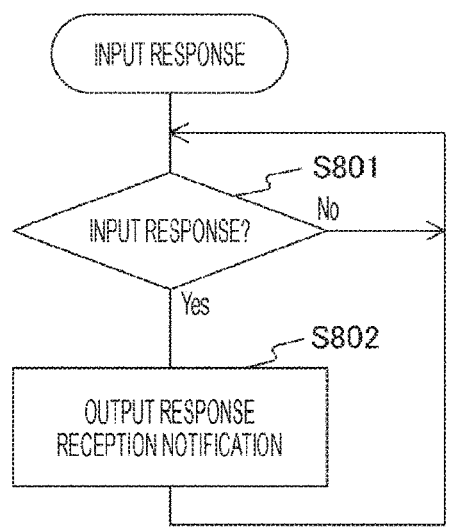
FIG. 11 is a view illustrating an example of a procedure of a response inputting process in the first embodiment of the present technology.

FIG. 11 is a view illustrating an example of a procedure of a response inputting process in the first embodiment of the present technology. The request control unit 257 waits until the response is input from the memory 300 (step S801), and in a case where the response is input (step S801: Yes), this notifies the writing time prediction information generating unit 258 of the response reception (step S802). Thereafter, the request control unit 257 shifts to the process at step S801 again and repeatedly executes the response inputting process.

[Writing Time Measurement Starting Process]

Figure 12:
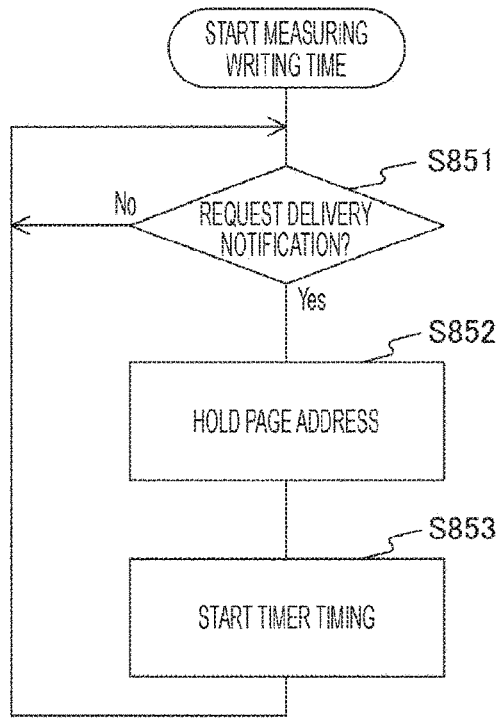
FIG. 12 is a view illustrating an example of a procedure of a writing time measurement starting process in the first embodiment of the present technology.

FIG. 12 is a view illustrating an example of a procedure of a writing time measurement starting process in the first embodiment of the present technology. The writing time prediction information generating unit 258 waits until the request delivery notification is input from the request control unit 257 (step S851). When the request delivery notification is input (step S851: Yes), the writing time prediction information generating unit 258 allows the page address holding unit corresponding to the memory chip identification number included in the request delivery notification to hold the page address (step S852). Next, the writing time prediction information generating unit 258 allows the timer corresponding to the memory chip identification number included in the request delivery notification to start measuring time (step S853). Thereafter, the writing time prediction information generating unit 258 shifts to the process at step S851 and repeatedly executes the writing time measurement starting process.

[Writing Time Measurement Finishing Process]

Figure 13:
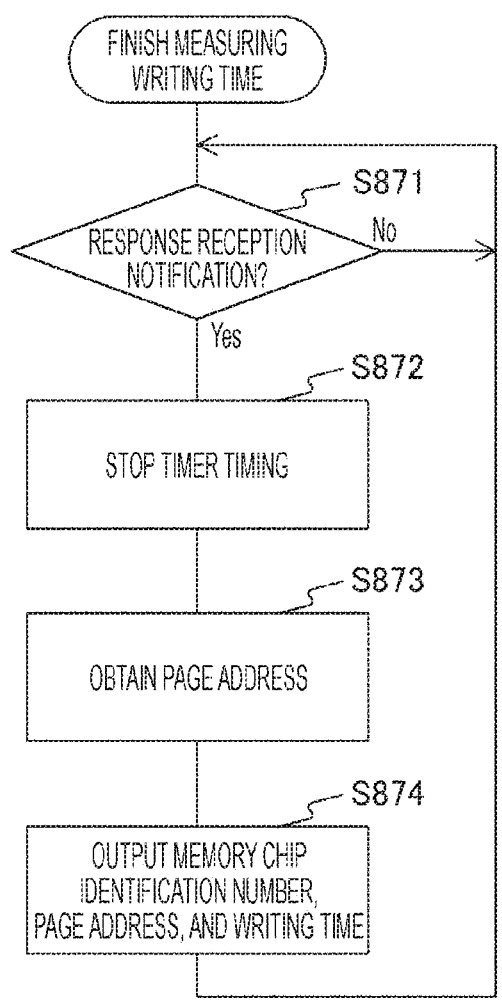
FIG. 13 is a view illustrating an example of a procedure of a writing time measurement finishing process in the first embodiment of the present technology.

FIG. 13 is a view illustrating an example of a procedure of a writing time measurement finishing process in the first embodiment of the present technology. The writing time prediction information generating unit 258 waits until the response reception notification is input from the request control unit 257 (step S871). When the response reception notification is input (step S871: Yes), the writing time prediction information generating unit 258 allows the timer corresponding to the memory chip identification number included in the response reception notification to stop measuring time (step S872). Next, the writing time prediction information generating unit 258 obtains the page address from the page address holding unit corresponding to the memory chip identification number included in the response reception notification (step S873). Next, the writing time prediction information generating unit 258 outputs the memory chip identification number, the page address, and the writing time to the writing time prediction information holding unit 259 (step S874). Thereafter, the writing time prediction information generating unit 258 shifts to the process at step S871 and repeatedly executes the writing time measurement finishing process.

In this manner, in the first embodiment of the present technology, the writing time in the memory chip (memory module) is measured to be held as the writing time prediction information. When a plurality of write requests is issued, the write request the long writing time of which is predicted is preferentially selected on the basis of the writing time prediction information and issued to the memory module, so that the writing time may be shortened.

[First Variation]

Measured writing time is made writing time prediction information in the above-described embodiment. On the other hand, it is also possible to measure the number of times of verification performed in a memory 300 and make the same the writing time prediction information. This is because the writing time and the number of times of verification are in a proportional relationship and it is possible to predict the writing time by the number of times of verification.

The number of times of verification may be measured by obtaining the number of times of verification from the memory 300 as described later, for example. Each of memory chips #0 (320) to #3 (350) in a first variation further outputs the number of times of verification in addition to a write result when outputting a response. A request control unit 257 further outputs the number of times of verification in addition to a memory chip identification number and the like when outputting a response reception notification. A writing time prediction information generating unit 258 allows a writing time prediction information holding unit 259 to hold the number of times of verification as the writing time prediction information. With this arrangement, it is possible to allow the writing time prediction information holding unit 259 to hold the number of times of verification as the writing time prediction information.

With this arrangement, the measurement of the writing time in a memory controller 200 may be omitted and it is possible to simplify a process in the memory controller 200.

[Second Variation]

Measured writing time is made writing time prediction information in the above-described embodiment. On the other hand, it is also possible to make the number of times of writing in memory chips #0 (320) to #3 (350) the writing time prediction information. A storage element 321 illustrated in FIG. 4 is damaged by the writing and the number of times of verification increases as the number of times of writing increases. That is to say, this is because the writing time and the number of times of writing are in a proportional relationship and it is possible to predict the writing time by the number of times of writing.

The number of times of writing may be obtained in the following manner. A writing time prediction information generating unit 258 in a second variation obtains the writing time prediction information being the number of times of writing held in a writing time prediction information holding unit 259 to increment each time request delivery notification is output and allows the writing time prediction information holding unit 259 to hold the same. With this arrangement, it becomes possible to allow the writing time prediction information holding unit 259 to hold the number of times of writing as the writing time prediction information.

With this arrangement, the measurement of the writing time in a memory controller 200 may be omitted and it is possible to simplify a process in the memory controller 200.

[Third Variation]

Measured writing time is made writing time prediction information in the above-described embodiment. On the other hand, it is also possible to make the number of times of unsuccessful writing in memory chips #0 (320) to #3 (350) the writing time prediction information. In a case where a value of a memory cell 323 is not a desired value even though verification and rewriting are performed predetermined number of times as illustrated in FIG. 4, a memory 300 processes supposing that the writing is unsuccessful. The memory 300 may perform a process of changing a condition of writing, for example, write voltage to be applied to a storage element 321 to write again as this process. This is because, in such a system which performs the process of the unsuccessful writing, the number of times of unsuccessful writing and the writing time are in a proportional relationship and it is possible to predict the writing time by the number of times of unsuccessful writing in place of the writing time.

The number of times of unsuccessful writing may be obtained in the following manner. Each of the memory chips #0 (320) to #3 (350) further outputs the number of times of unsuccessful writing in addition to a write result when outputting a response. A request control unit 257 further outputs the number of times of unsuccessful writing in addition to a memory chip identification number and the like when outputting response reception notification. A writing time prediction information generating unit 258 allows a writing time prediction information holding unit 259 to hold the number of times of unsuccessful writing included in the response reception notification as the writing time prediction information. With this arrangement, it becomes possible to allow the writing time prediction information holding unit 259 to hold the number of times of unsuccessful writing as the writing time prediction information.

With this arrangement, the measurement of the writing time in a memory controller 200 may be omitted and it is possible to simplify a process in the memory controller 200.

[Fourth Variation]

Measured writing time is made writing time prediction information in the above-described embodiment. On the other hand, it is also possible to make the number of bits in which an error is corrected by an error correcting unit 261 the writing time prediction information. It is considered that a storage element 321 in a memory cell corresponding to the bit the error of the data read therefrom is corrected is extremely damaged. It is considered that the number of times of verification and the number of times of unsuccessful writing are large in the writing in a page including such memory cell, so that it is possible to predict the writing time by the number of bits in which the error is corrected in place of the writing time.

The number of bits in which the error is corrected may be obtained in the following manner. The error correcting unit 261 outputs the number of bits in which the error is corrected to a writing time prediction information generating unit 258 when correcting the error of the read data. The writing time prediction information generating unit 258 allows a writing time prediction information holding unit 259 to hold the number of bits in which the error is corrected as the writing time prediction information. With this arrangement, it becomes possible to allow the writing time prediction information holding unit 259 to hold the number of bits in which the error is corrected as the writing time prediction information.

With this arrangement, the measurement of the writing time in a memory controller 200 may be omitted and it is possible to simplify a process in the memory controller 200.

2. Second Embodiment

Writing time prediction information is measured and held for each page in the above-described embodiment. On the other hand, this is measured and held for every plurality of pages in a second embodiment of the present technology. With this arrangement, it becomes possible to make a size of the writing time prediction information small.

[Writing Time Prediction Information]

FIG. 14 is a view illustrating the writing time prediction information in the second embodiment of the present technology. In FIG. 14, time required for writing in each memory chip is recorded for each block formed of a plurality of pages. In FIG. 14, the writing time prediction information of each memory chip is held in each of 256 blocks. For example, 4096 pages may be supposed as a size of the block. This is a configuration equivalent to that in a case in which upper eight bits of a page address illustrated in FIG. 7 are made a block address and a storage area of each memory chip is divided into 265 blocks. In such configuration, the page addresses of the pages included in each block are continuous and it becomes highly possible that data files of the same usage mode are stored in the pages included in the same block. Therefore, it is predicted that the number of times of writing is equivalent in each page included in the block and it is highly possible that the writing time has a near value. Therefore, it is possible to hold the writing time prediction information in block unit and predict the writing time of the pages included in the block by using the same.

By managing the writing time prediction information for each block, it is possible to make the size of the writing time prediction information small. For example, the number of entries of the writing time prediction information in FIG. 14 may be made a value obtained by dividing the writing time prediction information in FIG. 7 by 4096.

Meanwhile, it is possible to use an average value of the writing time in the pages included in the block as the writing time of each block. This may be calculated on the basis of the following equation, for example, in a case where the average value in a case in which the writing is performed n times in the pages included in the block is Tave(n).

$$Tave(n)=(Tave(n-1)+Tn)/2 \qquad \text{Equation 1}$$

In the equation, Tave(n−1) represents the average value of the writing time when (n−1)th writing is performed. Tn represents nth writing time. In this case, the average value is calculated while substituting first writing time into Tave(n−1) and Tn at the time of the first writing. It is also possible to calculate on the basis of the following equation, for example.

$$Tave(n)=((n-1) \times Tave(n-1)+Tn)/n \qquad \text{Equation 2}$$

In a case where equation 2 is utilized, it is weighted by the number of times of writing n, so that a calculation amount increases as compared to a case in which equation 1 is utilized and it is further required to hold the number of times of writing n for each block. However, it is possible to calculate the average value of the writing time more correctly.

A request selecting unit 256 obtains the prediction information of the writing time from the writing time prediction information held in a writing time prediction information holding unit 259 by a memory chip identification number and values of upper eight bits of the page address being the block address. Configurations of a memory access control unit 250 and a memory controller 200 other than this are similar to those of the memory access control unit 250 and the memory controller 200 in the first embodiment of the present technology, so that description thereof is not repeated.

In this manner, according to the second embodiment of the present technology, since the writing time prediction information is held in block unit, the size of the writing time prediction information may be made small and the memory controller 200 may be made compact.

3. Third Embodiment

Writing time prediction information is held for each page in the above-described first embodiment. On the other hand, this is held for each memory chip corresponding to a memory module in a third embodiment of the present technology. With this arrangement, it becomes possible to make a size of the writing time prediction information small.

[Writing Time Prediction Information]

FIG. 15 is a view illustrating the writing time prediction information in the third embodiment of the present technology. FIG. 15 illustrates order of priority at the time of writing in each memory chip. Also, the order of priority is obtained by assigning numbers in descending order of writing time in the memory chips. In a case where the writing time in each of memory chips #0 (320) to #3 (350) is known, measurement of the writing time in the memory controller 200 may be omitted and fixed order of priority may be used as the writing time prediction information. For example, the writing time is measured at the time of shipping from a factory for the memory chips to be used and the order of priority based on this is generated to be held in a writing time prediction information holding unit 259 as the writing time prediction information. A request selecting unit 256 obtains the order of priority of the memory chips from the writing time prediction information held in the writing time prediction information holding unit 259 by a memory chip identification number and selects a write request to the memory chip long writing time of which is predicted. Since the writing time is not measured in the third embodiment of the present technology, it is not required to provide a writing time prediction information generating unit 258. Configurations of a memory access control unit 250 and a memory controller 200 other than this are similar to those of the memory access control unit 250 and the memory controller 200 in the first embodiment of the present technology, so that description thereof is not repeated.

In this manner, according to the third embodiment of the present technology, since the fixed order of priority for each memory chip (memory module) is used as the writing time prediction information, the size of the writing time prediction information may be made small. Also, the writing time prediction information generating unit may be omitted, so that a compact memory controller 200 may be realized.

[Variation]

Writing time is not measured at the time of execution of a write request and fixed order of priority is made writing time prediction information in the above-described third embodiment. On the other hand, it is also possible to measure the writing time and calculate an average value for each memory chip and make the same the writing time prediction information. This is because a size of the writing time prediction information may be made small and the writing time prediction information may be changed according to change in writing time associated with usage of the memory chip. In this case, the writing time is measured by a writing time prediction information generating unit 258 and the average value for each memory chip is calculated. Next, the average value is held in a writing time prediction information holding unit 259 as the writing time prediction information. Meanwhile, a method described in the second embodiment of the present technology may be used for calculating the average value.

4. Fourth Embodiment

Writing time prediction information is held for each page in the above-described first embodiment. On the other hand, in a fourth embodiment of the present technology, the writing time prediction information is held for each memory bank forming a memory module. With this arrangement, it is possible to speed up a writing process by preferentially executing a write request long writing time of which is predicted on the basis of the writing time prediction information also in a system in which the memory module including the memory bank is used.

[Configuration of Memory]

Figure 16:
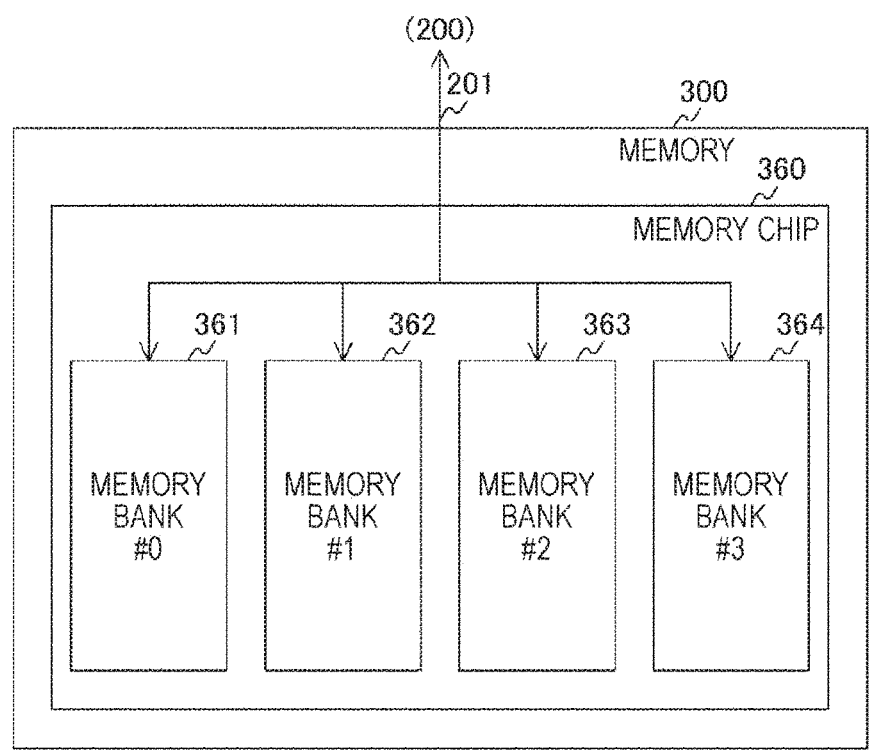
FIG. 16 is a view illustrating a configuration example of a memory 300 in a fourth embodiment of the present technology.

FIG. 16 is a view illustrating a configuration example of a memory 300 in the fourth embodiment of the present technology. The memory 300 is different from the memory 300 illustrated in FIG. 3 in that memory chips #0 (320) to #3 (350) are changed to a memory chip 360.

The memory chip 360 is provided with a memory bank #0 (361), a memory bank #1 (362), a memory bank #2 (363), and a memory bank #3 (364). Herein, the memory bank is a constitutional unit of a storage area of the memory chip 360 being the memory module. The memory bank is required to be specified by a bank address. Therefore, it is required to add the bank address in place of a memory chip identification number to a write request or a read request. Also, data in the memory banks may be independently accessed and this is accessed in page unit.

Meanwhile, the memory chip (360) is an example of the memory module recited in claims. That is to say, in the fourth embodiment of the present technology, the memory 300 including a single memory module is supposed and it is supposed that the memory module is formed of one memory chip including four memory banks. In this case, the writing time prediction information holding unit 259 holds the writing time prediction information for each of the memory banks #0 (361) to #3 (364). The writing time prediction information generating unit 258 generates the writing time prediction information for each of the memory banks #0 (361) to #3 (364). Request queues #0 (252) to #3 (255) hold requests to the memory banks #0 (361) to #3 (364), respectively. Furthermore, a request selecting unit 256 selects the write request of which longer writing time is predicted out of the write requests to the memory banks #0 (361) to #3 (364) on the basis of the writing time prediction information.

A configuration of an information processing system other than this is similar to that of the information processing system described in the first embodiment of the present technology, so that the description thereof is not repeated.

In this manner, in the fourth embodiment of the present technology, the write request of which longer writing time is predicted is preferentially executed on the basis of the writing time prediction information in the memory chip (memory module) including a plurality of memory banks. With this arrangement, the writing them may be shortened.

[Variation]

In the above-described fourth embodiment, writing time prediction information is held for each page in a memory chip including a memory bank. On the other hand, it is also possible to hold the writing time prediction information for each block formed of a plurality of pages in each memory bank. This is because a size of the writing time prediction information may be made small as in the second embodiment of the present technology. Meanwhile, a method similar to that of the second embodiment of the present technology may be used for measuring the writing time prediction information for each block.

As described above, in the embodiment of the present technology, the write request of which longer writing time is predicted is preferentially selected to be executed on the basis of the writing time prediction information in the memory module in which the writing time of each page is not constant. With this arrangement, the writing time may be shortened.

Meanwhile, the above-described embodiments describe an example of embodying the present technology, and there is a correspondence relationship between matters in the embodiments and the matters specifying the invention in claims. Similarly, there is a correspondence relationship between the matters specifying the invention in claims and the matters in the embodiments of the present technology having the same names. However, the present technology is not limited to the embodiments and may be embodied with various modifications of the embodiment without departing from the spirit thereof.

Also, the procedures described in the above-described embodiments may be considered as a method including a series of procedures and may be considered as a program for allowing a computer to execute the series of procedures and a recording medium which stores the program. A compact disc (CD), a MiniDisc (MD), a digital versatile disc (DVD), a memory card, a Blu-Ray™ Disc and the like may be used, for example, as the recording medium.

Meanwhile, the effect described in this specification is illustrative only and is not limitative; there may also be another effect.

Meanwhile, the present technology may also have a following configuration.

(1) A memory controller including:

a writing time prediction information holding unit which holds writing time prediction information for predicting writing time in a plurality of memory modules for each of the plurality of memory modules; and a request selecting unit which preferentially selects a write request of which longer writing time is predicted out of a plurality of write requests requiring writing in each of the plurality of memory modules on the basis of the writing time prediction information.

(2) The memory controller according to (1) described above, further including: a writing time prediction information generating unit which generates the writing time prediction information to be held in the writing time prediction information holding unit.

(3) The memory controller according to (2) described above, in which the writing time prediction information generating unit measures the writing time for each of the plurality of memory modules to be held in the writing time prediction information holding unit as the writing time prediction information.

(4) The memory controller according to (2) described above, in which the writing time prediction information generating unit measures the number of times of verification to read data from the plurality of memory modules in which the writing is performed to determine whether the read data and write data regarding the writing are the same for each of the plurality of memory modules to be held in the writing time prediction information holding unit as the writing time prediction information.

(5) The memory controller according to (2) described above, in which the writing time prediction information generating unit measures the number of times of writing in the plurality of memory modules for each of the plurality of memory modules to be held in the writing time prediction information holding unit as the writing time prediction information.

(6) The memory controller according to (2) described above, further including:

an error correcting unit which detects to correct an error of read data read from the plurality of memory modules, in which the writing time prediction information generating unit measures the number of bits in which the error is corrected by the error correcting unit in the corrected read data for each of the plurality of memory modules to be held in the writing time prediction information holding unit as the writing time prediction information.

(7) The memory controller according to (2) described above, in which the writing time prediction information generating unit measures the number of times of unsuccessful writing in the plurality of memory modules for each of the plurality of memory modules to be held in the writing time prediction information holding unit as the writing time prediction information.

(8) The memory controller according to any one of (1) to (7) described above, further including:

a plurality of request queues each of which is provided for each of the plurality of memory modules to hold the write requests for each of the plurality of memory modules in a first-in first-out manner, in which the request selecting unit selects on the basis of the writing time prediction information from the write requests held at the top of the plurality of request queues.

(9) The memory controller according to any one of (1) to (8) described above, in which the plurality of memory modules is such that a storage area in which data is stored is accessed in unit of page obtained by dividing according to a page size, and the writing time prediction information holding unit holds the writing time prediction information for each page.

(10) The memory controller according to any one of (1) to (8) described above, in which the plurality of memory modules is such that a storage area in which data is stored is accessed in unit of page obtained by dividing according to a page size, and the writing time prediction information holding unit holds the writing time prediction information for each block formed of a plurality of pages.

(11) A memory controller including:

a writing time prediction information holding unit which holds writing time prediction information for predicting writing time in a plurality of memory banks in a memory module in which a storage area in which data is stored is formed of the plurality of memory banks for each of the plurality of memory banks; and a request selecting unit which preferentially selects a write request of which longer writing time is predicted out of a plurality of write requests requiring writing in each of the plurality of memory banks on the basis of the writing time prediction information.

(12) A storage device including:
a plurality of memory modules;
a writing time prediction information holding unit which holds writing time prediction information for predicting writing time in the plurality of memory modules for each of the plurality of memory modules; and
a request selecting unit which preferentially selects a write request of which longer writing time is predicted out of a plurality of write requests requiring writing in each of the plurality of memory modules on the basis of the writing time prediction information.

(13) An information processing system including:
a storage device provided with:
a plurality of memory modules;
a writing time prediction information holding unit which holds writing time prediction information for predicting writing time in the plurality of memory modules for each of the plurality of memory modules; and
a request selecting unit which preferentially selects a write request of which longer writing time is predicted out of a plurality of write requests requiring writing in each of the plurality of memory modules on the basis of the writing time prediction information; and
a host computer which accesses the storage device.

(14) A method of controlling a memory including: a request selecting procedure to preferentially select a write request of which longer writing time is predicted out of a plurality of write requests requiring writing in each of a plurality of memory modules on the basis of writing time prediction information for predicting the writing time.

REFERENCE SIGNS LIST

100 Host computer
200 Memory controller
210 Host interface
220 Processor
230 ROM
240 RAM
250 Memory access control unit
251 Command converting unit
256 Request selecting unit
257 Request control unit
258 Writing time prediction information generating unit
259 Writing time prediction information holding unit
261 Error correcting unit
271 Control unit
272 to 275 Page address holding unit
276 to 279 Timer
290 Memory interface
300 Memory
320, 330, 340, 350, 360, 371, 381, 382 Memory chip
370, 380 Memory module
321 Storage element
322 MOSFET
323 Memory cell
361 to 364 Memory bank

The invention claimed is:
1. A memory controller, comprising:
a memory configured to store writing time prediction information corresponding to each of a plurality of memory modules; and
circuitry configured to:
receive a plurality of write requests to write data in the plurality of memory modules;
predict a first writing time corresponding to a first write request of the plurality of write requests and a second writing time corresponding to a second write request of the plurality of write requests, based on the writing time prediction information; and
select the first write request of the plurality of write requests based on the predicted first writing time is longer than the predicted second writing time.

2. The memory controller according to claim 1, wherein the circuitry is further configured to generate the writing time prediction information.

3. The memory controller according to claim 2, wherein the writing time prediction information is generated based on a writing time for each of the plurality of memory modules.

4. The memory controller according to claim 2, wherein the writing time prediction information is generated based on a count of verification;
wherein the verification indicates that the data read from the plurality of memory modules and the data written into the plurality of memory modules are same.

5. The memory controller according to claim 2, wherein the writing time prediction information is generated based on a count of write in each of the plurality of memory modules.

6. The memory controller according to claim 2, wherein the circuitry is further configured to:
detect an error in the data read from the plurality of memory modules,
correct the error in the data read from the plurality of memory modules, and
generate the writing time prediction information based on a number of bits that are corrected in the data.

7. The memory controller according to claim 2, wherein the writing time prediction information is generated based a count of unsuccessful write in each of the plurality of memory modules.

8. The memory controller according to claim 1,
wherein a plurality of request queues stores the plurality of write requests for each of the plurality of memory modules in a first-in first-out manner,
wherein each of the plurality of request queues corresponds to a memory module of the plurality of memory modules,
wherein the circuitry is further configured to select the first write request of the plurality of write requests stored at a top of the plurality of request queues.

9. The memory controller according to claim 1, wherein the plurality of memory modules is such that a storage area in which the data is stored is accessed in a unit of page obtained by a division of the storage area based on a page size, and
the memory is further configured to store the writing time prediction information for each of a plurality of pages.

10. The memory controller according to claim 9, wherein the memory is further configured to store the writing time prediction information for each of a plurality of blocks, wherein a block of the plurality of blocks comprises the plurality of pages.

11. A memory controller, comprising:
a memory configured to store writing time prediction information corresponding to each of a plurality of memory banks in a memory module; and circuitry configured to:
receive a plurality of write requests to write data in the plurality of memory banks;
predict a first writing time corresponding to a first write request of the plurality of write requests and a second writing time corresponding to a second write request of the plurality of write requests, based on the writing time prediction information; and
select the first write request of the plurality of write requests based on the predicted first writing time is longer than the predicted second writing time.

12. A storage device, comprising:
a plurality of memory modules, a memory configured to store writing time prediction information corresponding to each of the plurality of memory modules; and
circuitry configured to:
receive a plurality of write requests to write data in the plurality of memory modules;
predict a first writing time corresponding to a first write request of the plurality of write requests and a second writing time corresponding to a second write request of the plurality of write requests, based on the writing time prediction information; and
select the first write request of the plurality of write requests based on the predicted first writing time is longer than the predicted second writing time.

13. An information processing system, comprising:
a storage device that includes:
a plurality of memory modules;
a memory configured to store writing time prediction information corresponding to each of the plurality of memory modules; and
circuitry configured to:
receive a plurality of write requests to write data in the plurality of memory modules;
predict a first writing time corresponding to a first write request of the plurality of write requests and a second writing time corresponding to a second write request of the plurality of write requests, based on the writing time prediction information; and
select the first write request of the plurality of write requests based on the predicted first writing time is longer than the predicted second writing time; and
a host computer configured to access the storage device.

14. A non-transitory computer-readable medium having stored thereon computer-executable instructions, which when executed by a computer, cause the computer to execute operations, the operations comprising:
storing writing time prediction information corresponding to each of a plurality of memory modules in a memory;
receiving a plurality of write requests to write data in the plurality of memory modules;
predicting a first writing time corresponding to a first write request of the plurality of write requests and a second writing time corresponding to a second write request of the plurality of write requests, based on the writing time prediction information; and
selecting the first write request of the plurality of write requests based on the predicted first writing time is longer than the predicted second writing time.

* * * * *